(12) United States Patent
Yang et al.

(10) Patent No.: US 7,795,082 B2
(45) Date of Patent: Sep. 14, 2010

(54) METHOD OF FABRICATING THIN FILM TRANSISTOR

(75) Inventors: Tae-Hoon Yang, Suwon-si (KR); Ki-Yong Lee, Suwon-si (KR); Jin-Wook Seo, Suwon-si (KR); Byoung-Keon Park, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 206 days.

(21) Appl. No.: 11/741,273

(22) Filed: Apr. 27, 2007

(65) Prior Publication Data

US 2007/0267704 A1 Nov. 22, 2007

(30) Foreign Application Priority Data

May 18, 2006 (KR) .................. 10-2006-0044817

(51) Int. Cl.
*H01L 21/00* (2006.01)
(52) U.S. Cl. .................. 438/154; 438/157; 438/162; 438/542; 257/E21.4; 257/E21.421; 257/E21.611
(58) Field of Classification Search .................. 438/154, 438/157, 162, 164, 542; 257/E21.4, E21.421, 257/E21.611
See application file for complete search history.

(56) References Cited

U.S. PATENT DOCUMENTS

| 6,346,437 | B1 | 2/2002 | Maekawa et al. |
| 6,624,051 | B1 | 9/2003 | Ohtani et al. |
| 6,855,956 | B2 * | 2/2005 | Yamazaki et al. ............. 257/59 |
| 7,235,828 | B2 * | 6/2007 | Ohtani et al. ............... 257/288 |
| 2002/0106841 | A1 | 8/2002 | Yamazaki et al. |
| 2003/0155573 | A1 | 8/2003 | Yamazaki et al. |
| 2004/0238820 | A1 | 12/2004 | Sakama et al. |
| 2005/0239267 | A1 | 10/2005 | Tobashi |
| 2005/0285110 | A1 | 12/2005 | Seo et al. |
| 2006/0040429 | A1 | 2/2006 | Park et al. |
| 2006/0046357 | A1 | 3/2006 | Lee et al. |

FOREIGN PATENT DOCUMENTS

CN 1395319 A 2/2003

(Continued)

OTHER PUBLICATIONS

U.S. Appl. No. 11/741,307, filed Apr. 27, 2007, Tae-hoon Yang et al, Samsung SDI Co., Ltd.

(Continued)

*Primary Examiner*—Hsien-ming Lee
(74) *Attorney, Agent, or Firm*—Stein McEwen, LLP

(57) ABSTRACT

A method of fabricating a CMOS thin film transistor includes: providing a substrate; forming an amorphous silicon layer on the substrate; performing a first annealing process on the substrate and crystallizing the amorphous silicon layer into a polysilicon layer; patterning the polysilicon layer to form first and second semiconductor layers; implanting first impurities into the first and second semiconductor layers; implanting second impurities into the first or second semiconductor layer; and performing a second annealing process on the semiconductor layers to remove the metal catalyst remaining in the first or second semiconductor layer, on which the second impurities are implanted, wherein the first impurities are implanted at a dose of $6 \times 10^{13}/cm^2$ to $5 \times 10^{15}/cm^2$, and the second impurities are implanted at a dose of $1 \times 10^{11}/cm^2$ to $3 \times 10^{15}/cm^2$.

17 Claims, 17 Drawing Sheets

FOREIGN PATENT DOCUMENTS

| | | |
|---|---|---|
| CN | 1741256 A | 3/2006 |
| EP | 1017108 | 7/2000 |
| EP | 1612852 | 1/2006 |
| JP | 08-330602 | 12/1996 |
| JP | 10-242476 | 9/1998 |
| KR | 1999-14341 | 2/1999 |
| KR | 2003-3043 | 1/2003 |
| KR | 2003-60403 | 7/2003 |
| KR | 2003-69852 | 8/2003 |
| KR | 2004-41074 | 5/2004 |
| KR | 2005-23160 | 3/2005 |
| KR | 2005-42630 | 5/2005 |
| KR | 2005-88588 | 9/2005 |
| KR | 2005-121599 | 12/2005 |
| KR | 2005-122136 | 12/2005 |
| KR | 2006-1750 | 1/2006 |
| WO | WO 2004/042805 | 5/2004 |

OTHER PUBLICATIONS

Office Action issued by Chinese Patent Office in Chinese Patent Application No. 2007101063436 on Nov. 28, 2008.
European Search Report issued in corresponding European Patent Application No. 07252056.2 dated Aug. 31, 2007.
Notice of Allowability issued in corresponding Korean Patent Application No. 2006-44817 dated Aug. 20, 2007.
Office Action issued in Chinese Patent Application No. 2007101040434 on Nov. 7, 2008.
European Search Report issued on Apr. 11, 2008 in European Patent Application No. 07252057.0.
Notice of Allowability issued in Korean Patent Application No. 2006-44814 dated Aug. 20, 2007.
English Abstract for Japanese Patent Publication No. 11-054760.

* cited by examiner

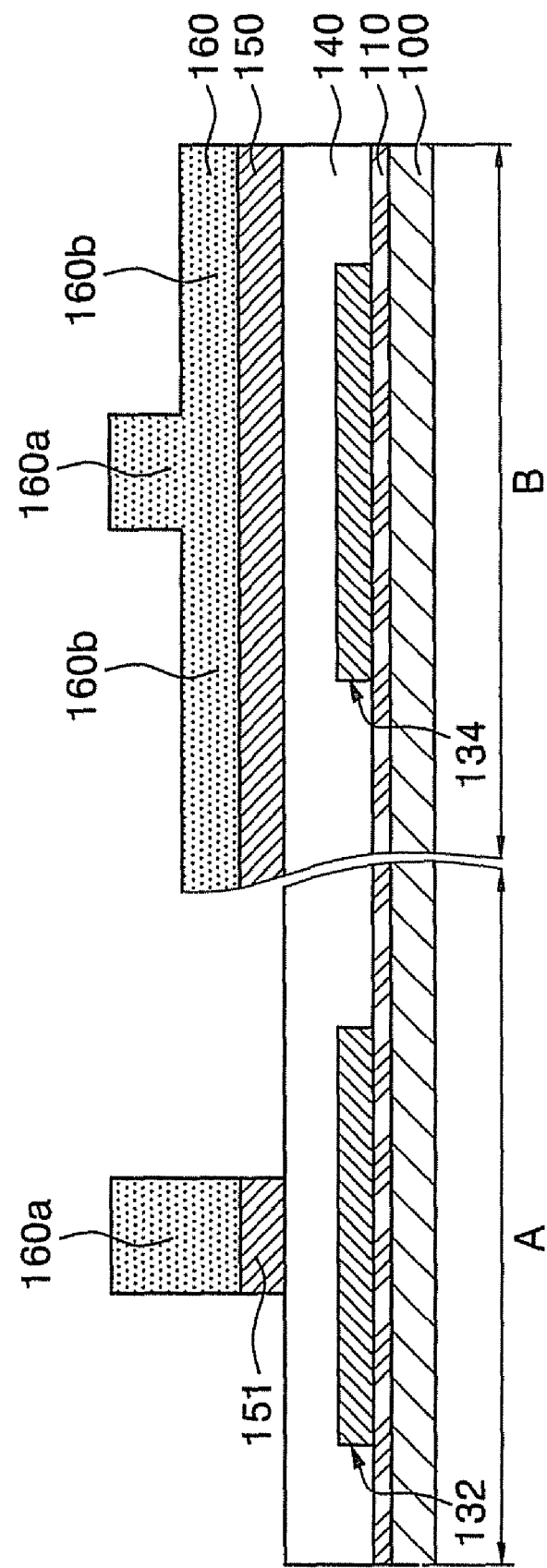

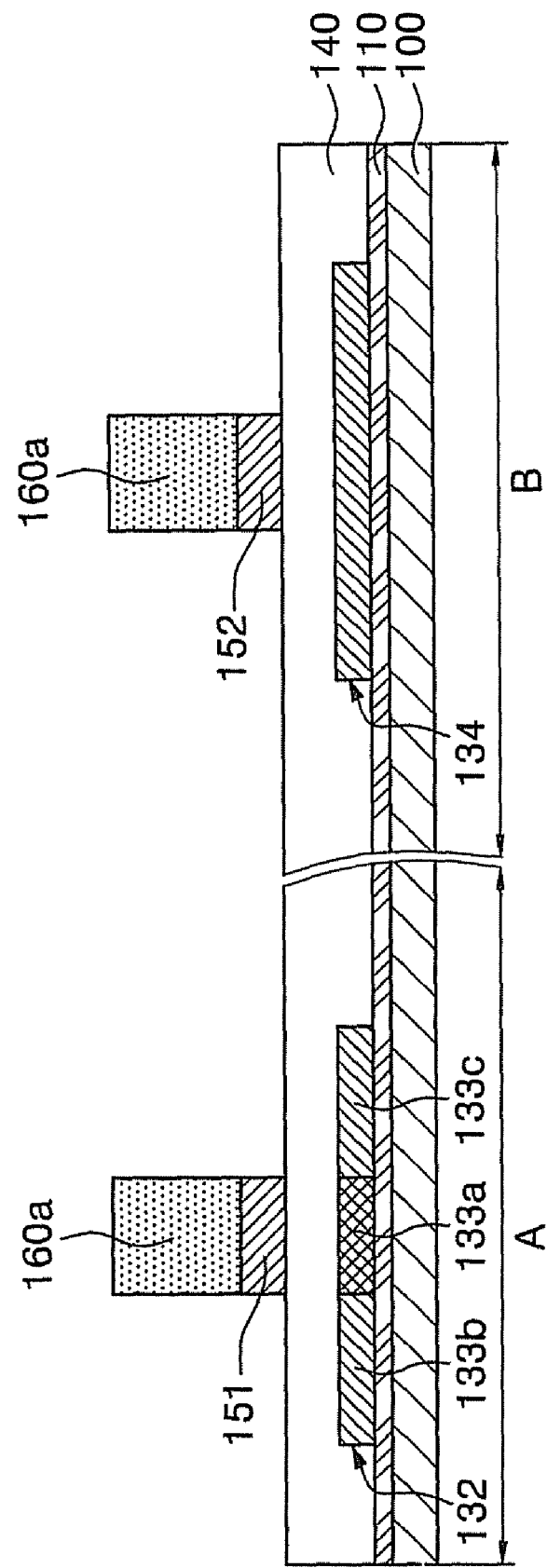

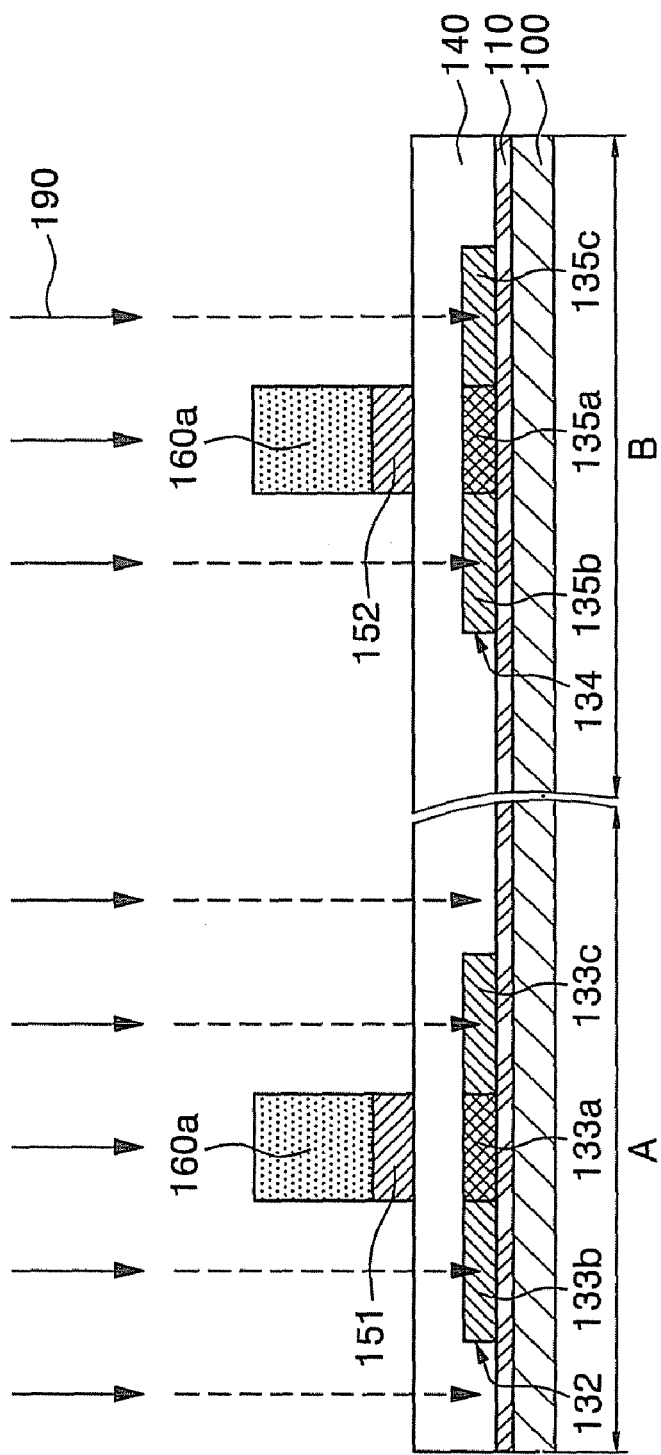

METHOD OF FABRICATING THIN FILM TRANSISTOR

CROSS-REFERENCE TO RELATED APPLICATION

This application claims the benefit of Korean Application No. 2006-44817, filed May 18, 2006 in the Korean Intellectual Property Office, the disclosure of which is incorporated herein by reference.

BACKGROUND OF THE INVENTION

1. Field of the Invention

Aspects of the present invention relate to a method of fabricating a thin film transistor. More particularly, aspects of the present invention relate to a method of fabricating a complimentary metal-oxide semiconductor (CMOS) thin film transistor in which, in order to remove metal catalysts remaining in a polysilicon layer after crystallizing an amorphous silicon layer to the polysilicon layer using a super grain silicon (SGS) crystallization method, when impurities such as phosphorus (P) are implanted into source and drain regions of a p-type metal-oxide semiconductor (PMOS) thin film transistor, the impurities are also simultaneously implanted into source and drain regions of an n-type metal-oxide semiconductor (NMOS) thin film transistor and a substrate is annealed. Accordingly, an amount of metal catalyst remaining in a semiconductor layer is minimized and its manufacturing process is simplified.

2. Description of the Related Art

A complimentary metal-oxide semiconductor (CMOS) thin film transistor includes a p-type metal-oxide semiconductor (PMOS) thin film transistor and an n-type metal-oxide semiconductor (NMOS) thin film transistor. The CMOS thin film transistor is advantageous in implementing various circuits and systems that are difficult to realize using only one of the PMOS or NMOS thin film transistor.

FIGS. 1A to 1D are cross-sectional views illustrating a related art method of fabricating a CMOS thin film transistor. As shown in FIG. 1A, a substrate 10 including a PMOS region P and an NMOS region N is provided. A PMOS semiconductor layer 21 and an NMOS semiconductor layer 23 are respectively formed on the PMOS and NMOS regions P and N using a first mask (not shown). A gate insulating layer 30 is formed on the semiconductor layers 21 and 23. A gate conductive layer 40 is deposited on the gate insulating layer 30. A photoresist pattern 91 is formed on the gate conductive layer 40 using a second mask (not shown), and the gate conductive layer 40 is etched using the photoresist pattern 91 as a mask.

Accordingly, a PMOS gate electrode 41 overlapping the PMOS semiconductor layer 21 is formed. Meanwhile, a gate conductive layer 40 is shielded by the photoresist pattern 91 and remains in the NMOS region N. Then, a high concentration of p-type impurities are implanted at respectively in regions P and N using the photoresist pattern 91 and the PMOS gate electrode 41 as masks to form source and drain regions 21$a$ and 21$c$ in the PMOS semiconductor layer 21. A non-doped region disposed between the source and drain regions 21$a$ is defined as a channel region 21$b$.

As shown in FIG. 1B, the photoresist pattern 91 (see FIG. 1A) is removed, and a new photoresist pattern 93 is formed using a third mask (not shown). The gate conductive layer 40 (see FIG. 1A) is etched in both P and N regions using the photoresist pattern 93 as a mask to form an NMOS gate electrode 43 overlapping the NMOS semiconductor layer 23.

Then, n-type impurities are implanted at a low concentration using the photoresist pattern 93 and the NMOS gate electrode 43 as masks, thereby forming low-concentration impurity regions 23$a$ and 23$c$ in the NMOS semiconductor layer 23. A non-doped region disposed between the low-concentration impurity regions 23$a$ is defined as a channel region 23$b$.

As shown in FIG. 1C, the photoresist pattern 93 (see FIG. 1B) is removed, and a new photoresist pattern 95 is formed using a fourth mask (not shown). A high concentration of n-type impurities are implanted using the photoresist pattern 95 as a mask to form high-concentration impurity regions 23$a$-1 in the NMOS semiconductor layer 23. At this time, the low-concentration impurity regions 23$a$-2 remain on sides of each of the high-concentration impurity regions 23$a$-1 to form lightly doped drain (LDD) regions (i.e., the low-concentration impurity regions 23$a$-2).

Referring to FIG. 1D, the photoresist pattern 95 (see FIG. 1C) is removed to expose the gate electrodes 41 and 43. An interlayer insulating layer 50 is formed on the exposed gate electrodes 41 and 43, and contact holes exposing ends of the semiconductor layers 21 and 23 are formed in the interlayer insulating layer 50 using a fifth mask (not shown). Then, PMOS source and drain electrodes 61 and NMOS source and drain electrodes 63 in contact with the ends of the semiconductor layers 21 and 23 are formed through the contact holes using a sixth mask (not shown), respectively.

However, the PMOS and NMOS thin film transistors are formed on a single substrate to form the related art CMOS thin film transistor, requiring numerous processes or operations. In particular, since the LDD regions 23$a$-2 are formed in order to solve reliability problems (such as a hot carrier effect caused by leakage current) and to enable miniaturization of the NMOS thin film transistor, the number of masks for implementing the CMOS thin film transistor is increased, the process is made complicated, and the process time is increased, thereby increasing manufacturing cost.

SUMMARY OF THE INVENTION

Aspects of the present invention include a method of fabricating a CMOS thin film transistor in which, in order to remove metal catalysts remaining in a polysilicon layer after crystallizing an amorphous silicon layer to the polysilicon layer using a super grain silicon (SGS) crystallization method, when impurities such as phosphorus (P) are implanted into source and drain regions of a PMOS thin film transistor, the impurities are also simultaneously implanted into source and drain regions of an NMOS thin film transistor and a substrate is annealed, thereby minimizing an amount of metal catalyst remaining in a semiconductor layer and simplifying its manufacturing process.

In various aspects of the present invention, a method of fabricating a CMOS thin film transistor includes: providing a substrate having first and second regions; forming an amorphous silicon layer on the substrate; forming a capping layer on the amorphous silicon layer; depositing a metal catalyst on the capping layer; performing a first annealing process on the substrate to diffuse the metal catalyst through the capping layer to an interface of the amorphous silicon layer and the capping layer, and to crystallize the amorphous silicon layer into a polysilicon layer using the diffused metal catalyst; removing the capping layer; patterning the polysilicon layer to form first and second semiconductor layers in the first and second regions, respectively; forming a gate insulating layer and a gate electrode on the first and second semiconductor layers; implanting first impurities into the first and second semiconductor layers; implanting second impurities into the first or second semiconductor layer; and performing a second annealing process on the first and second semiconductor layers to remove the metal catalyst remaining in the first or second semiconductor layer having the implanted second impurities, wherein the first impurities are implanted at a dose of $6\times10^{13}/cm^2$ to $5\times10^{15}/cm^2$, and the second impurities are implanted at a dose of $1\times10^{11}/cm^2$ to $3\times10^{15}/cm^2$.

In various aspects of the present invention, a method of fabricating a CMOS thin film transistor includes: providing a substrate having first and second regions; forming an amorphous silicon layer on the substrate; forming a capping layer on the amorphous silicon layer; depositing a metal catalyst on the capping layer; performing a first annealing process on the substrate to diffuse the metal catalyst through the capping layer to an interface of the amorphous silicon layer and the capping layer, and to crystallize the amorphous silicon layer into a polysilicon layer using the diffused metal catalyst; removing the capping layer; patterning the polysilicon layer to form first and second semiconductor layers in the first and second regions, respectively; forming a gate insulating layer and a gate electrode on the first and second semiconductor layers; implanting first impurities into the first or second semiconductor layer; implanting second impurities into the first and second semiconductor layers; and performing a second annealing process on the first and second semiconductor layers to remove the metal catalyst remaining in the semiconductor layer having the implanted first impurities, wherein the first impurities are implanted at a dose of $1\times10^{11}/cm^2$ to $3\times10^{15}/cm^2$, and the second impurities are implanted at a dose of $6\times10^{13}/cm^2$ to $5\times10^{15}/cm^2$.

In various aspects of the present invention, a method of forming a complimentary metal-oxide semiconductor (CMOS) having a p-type metal-oxide semiconductor (PMOS) and an n-type metal-oxide semiconductor (NMOS) includes: doping both the PMOS and the NMOS simultaneously with an impurity that getters remaining metal catalysts from the PMOS and forms a lightly doped drain region in the NMOS.

A CMOS thin film transistor obtained by the method includes the first semiconductor layer: and the second semiconductor layer, wherein the first and second semiconductors contain the first impurities and the first or second semiconductor contains the second impurities, and the first or second semiconductor layer with the implanted second impurities has the metal catalyst removed from therein by the second impurities and the second annealing process.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the aspects, taken in conjunction with the accompanying drawings of which:

FIGS. 2A to 2K are cross-sectional views illustrating a method of fabricating a CMOS thin film transistor in accordance with an aspect of the present invention;

DETAILED DESCRIPTION OF THE EMBODIMENTS

Figure 1A:
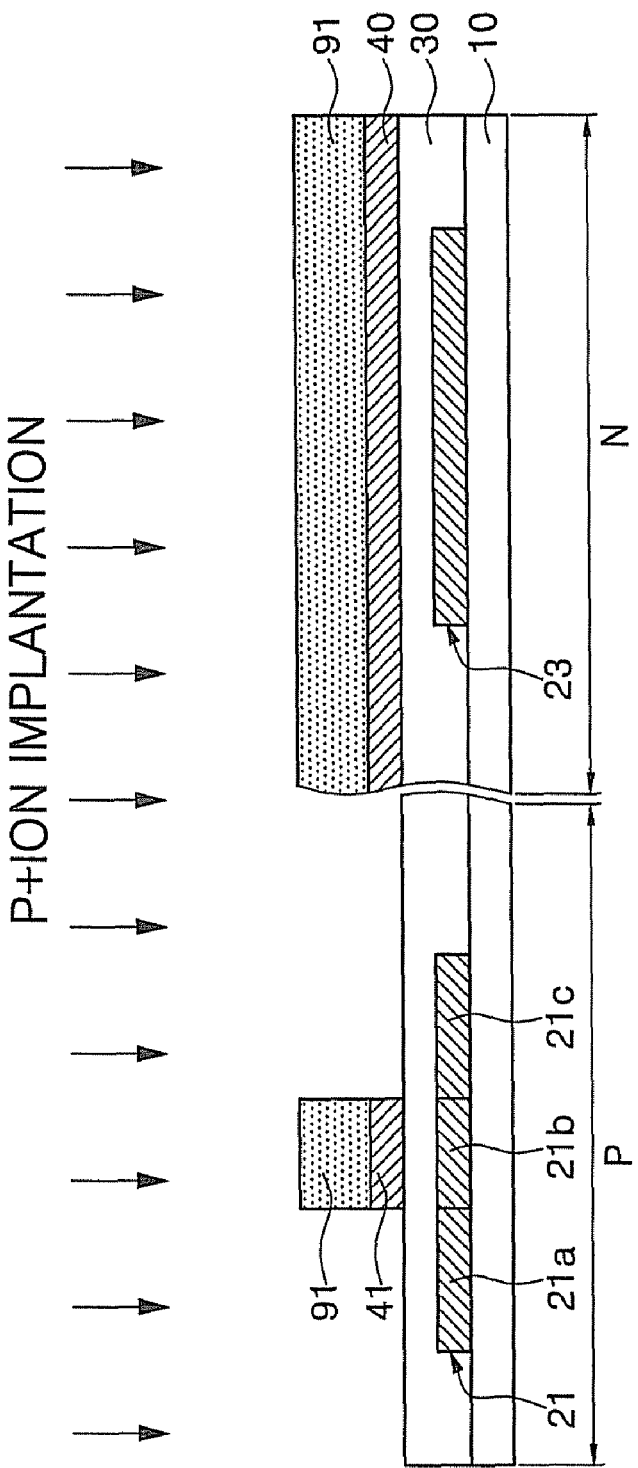
FIGS. 1A to 1D are cross-sectional views illustrating a related art method of fabricating a CMOS thin film transistor.
Figure 1B:
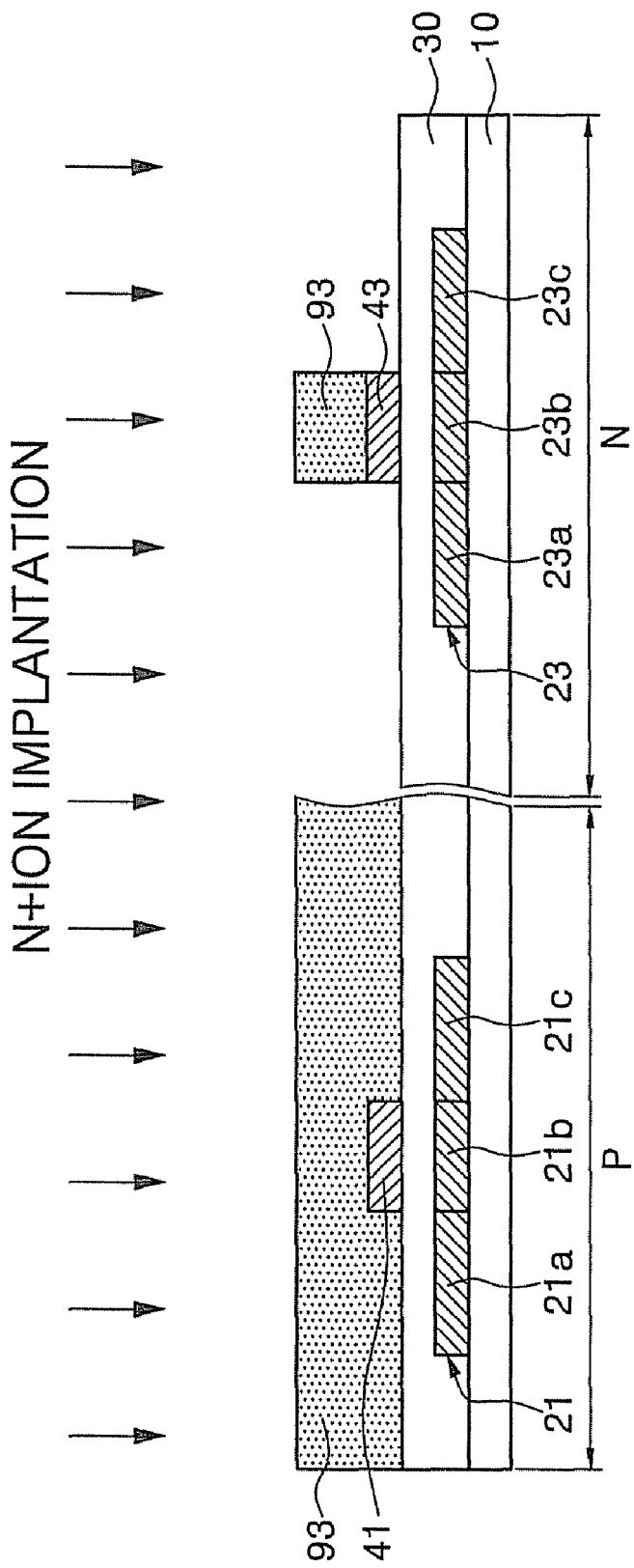
Figure 1C:
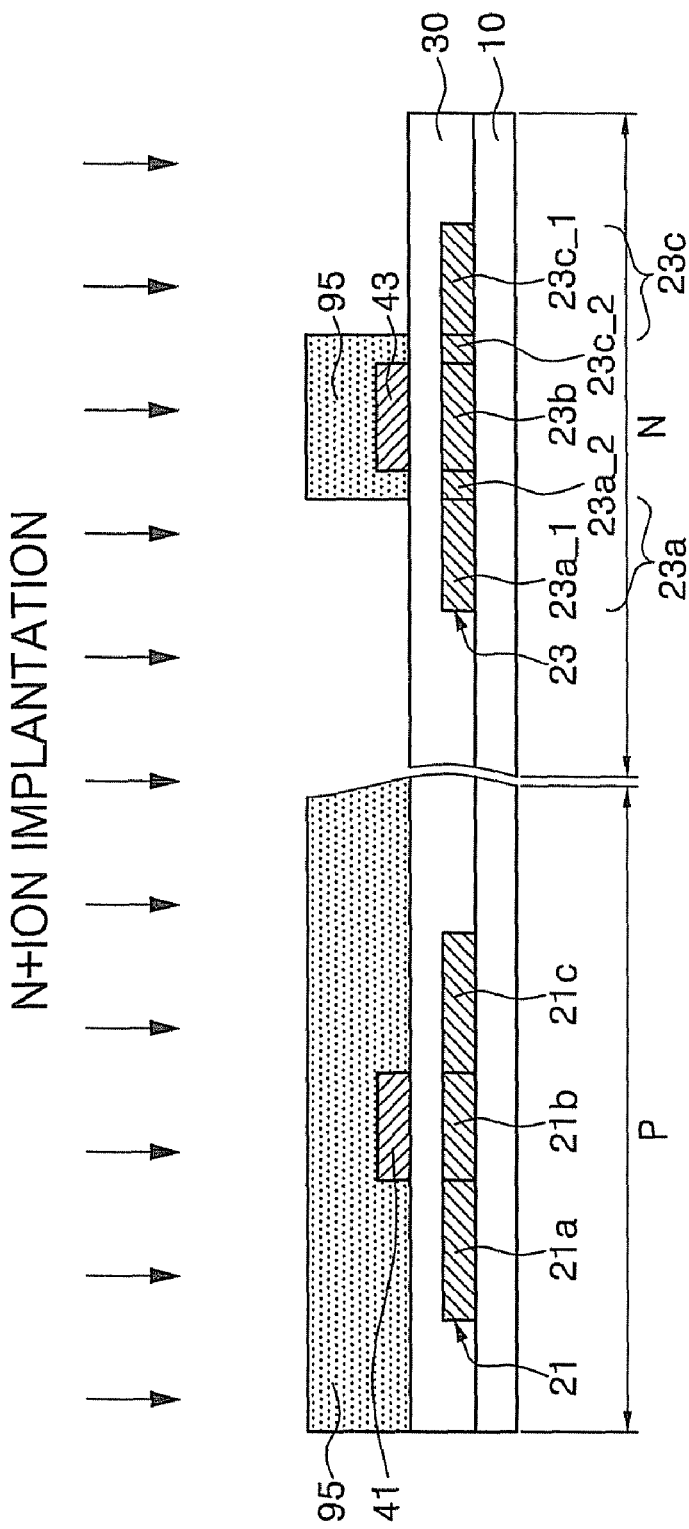
Figure 1D:
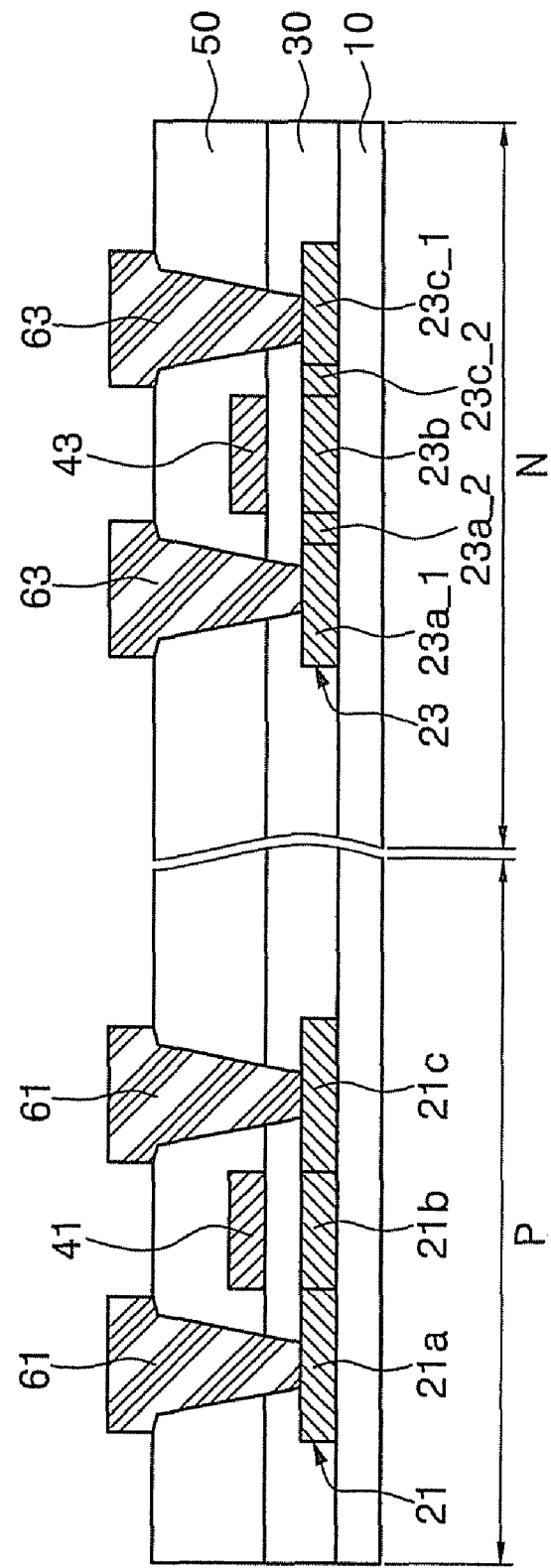

Reference will now be made in detail to aspects of the present invention, examples of which are illustrated in the accompanying drawings, wherein like reference numerals refer to the like elements throughout. The aspects are described below in order to explain the present invention by referring to the figures.

When it is mentioned that a layer is formed "on" another layer or substrate, the layer may be directly formed on the other layer or substrate, or a third layer may be interposed between them. In the drawings, the thickness of layers and regions may be exaggerated for clarity.

Figure 2A:
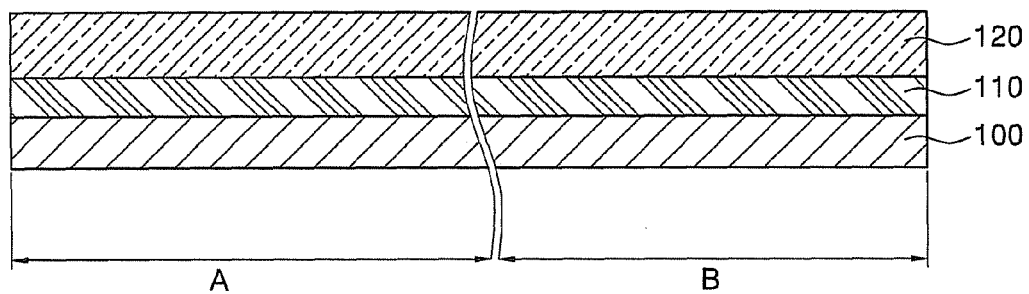

FIGS. 2A to 2K are cross-sectional views illustrating a method of fabricating a complimentary metal-oxide semiconductor (CMOS) thin film transistor in accordance with an aspect of the present invention. As shown in FIG. 2A, the CMOS thin film transistor includes a substrate 100 having first and second regions A and B. One of the first and second regions A and B is a region in which an n-type metal-oxide semiconductor (NMOS) thin film transistor is formed, and the other is a region in which a p-type metal-oxide semiconductor (PMOS) thin film transistor is formed. In various aspects, the substrate 100 may be a single crystalline silicon, glass, quartz, plastic, or the like.

A buffer layer 110 is formed on the substrate 100. While not required in all aspects, the buffer layer 110 may be a silicon oxide layer, a silicon nitride layer, or a double layer of a silicon oxide layer and a silicon nitride layer. The buffer layer 110 may be formed by a plasma-enhanced chemical vapor deposition (PECVD), a low-pressure chemical vapor deposition (LPCVD) method, or by other deposition and non-deposition methods. The buffer layer 110 is formed to facilitate crystallization of an amorphous silicon layer 120 by preventing diffusion of moisture or impurities generated from the substrate 100 or adjusting a heat transfer rate upon crystallization of the amorphous silicon layer 120.

As noted above, the amorphous silicon layer 120 is formed on the buffer layer 110 The amorphous silicon layer 120 may be formed by a chemical vapor deposition (CVD), physical vapor deposition (PVD) method, or by other deposition and non-deposition methods. In addition, during or after formation of the amorphous silicon layer 120, a dehydrogenation process may be additionally performed to lower the concentration of hydrogen in the amorphous silicon layer 120.

Figure 2B:
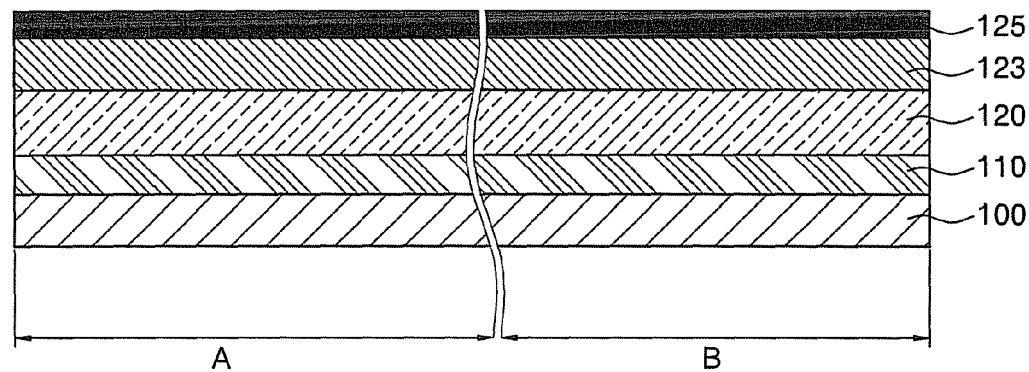

FIG. 2B is a cross-sectional view illustrating a process of forming a capping layer 123 and a metal catalyst layer 125 on the amorphous silicon layer 120. Referring to FIG. 2B, the capping layer 123 is formed on the amorphous silicon layer 120. The capping layer 123 may be formed of a silicon nitride layer or a double layer of a silicon nitride layer and a silicon oxide layer using a CVD or PVD method. A metal catalyst can be diffused through the capping layer 123 by an annealing process. In various aspects, the capping layer 123 is formed to a thickness at or between 1 and 2,000 Å. However, it is understood that the layer 123 can be otherwise formed, have other materials, and/or be of other thicknesses.

Subsequently, a metal catalyst is deposited on the capping layer 123 to form a metal catalyst layer 125. The metal catalyst of the metal catalyst layer 125 may be at least one of Ni, Pd, Ti, Ag, Au, Al, Sn, Sb, Cu, Co, Mo, Tr, Ru, Rh, Cd, Pt, or the like, or any combination thereof. Preferably, the metal catalyst may be Ni, though not required.

Generally, in a metal induced crystallization (MIC) or metal induced lateral crystallization (MILC) method, the thickness or density of the metal catalyst or the metal catalyst layer should be carefully adjusted or risk having the metal catalyst remain on the surface of a polysilicon layer after crystallization to cause an increase in the leakage current of a thin film transistor. However, in aspects of the present invention, the metal catalyst layer 125 may be formed to a large thickness rather than having the thickness or density of the metal catalyst layer 125 be precisely controlled. In other words, if the capping layer 123 filters the diffusing metal catalyst, only a very small amount of metal catalyst contributes to crystallization of the amorphous silicon layer 120. Accordingly, a large amount of metal catalyst can neither pass through the capping layer 123 nor contribute to the crystallization.

Figure 2C:
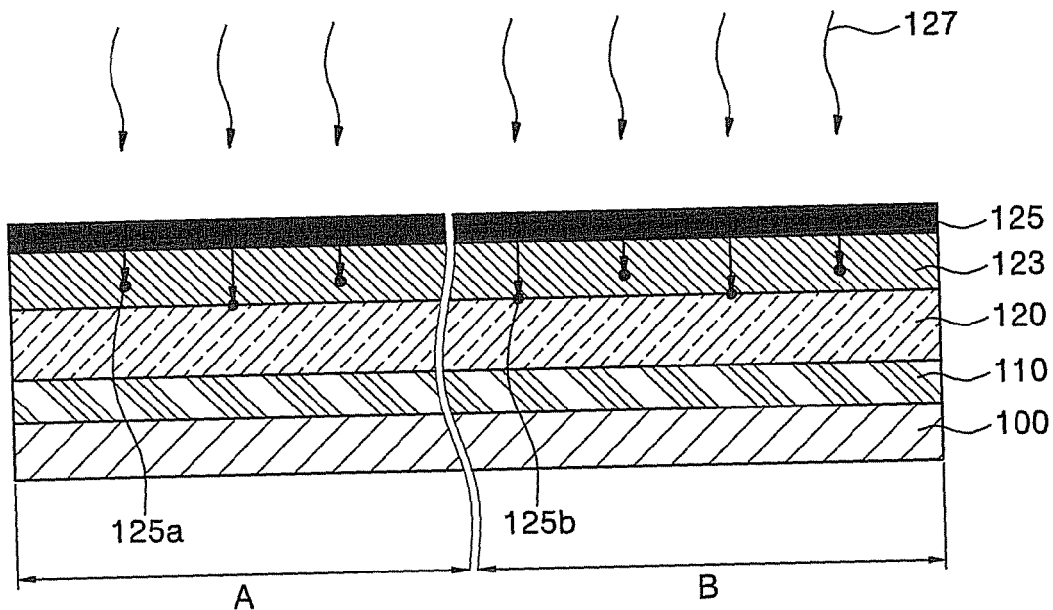

FIG. 2C is a cross-sectional view illustrating a process of diffusing a metal catalyst 125a, 125b of the metal catalyst layer 125 through the capping layer 123 and moving the metal catalyst 125b into the surface of the amorphous silicon layer 120 by applying a first annealing process to the substrate 100. As shown in FIG. 2C, a first annealing process represented by 127 is performed on the substrate 100 that includes the buffer layer 110, the amorphous silicon layer 120, the capping layer 123 and the metal catalyst layer 125. The first annealing process 127 moves some of the metal catalyst 125b of the metal catalyst layer 125 to the surface of the amorphous silicon layer 120. Specifically, during the first annealing process 127, only a very small amount of metal catalyst 125b diffuses into the surface of the amorphous silicon layer 120, while a large amount of metal catalyst 125a does not reach the amorphous silicon layer 120 or pass completely through the capping layer 123. Therefore, the amount of metal catalyst 125b reaching the surface of the amorphous silicon layer 120 depends on the diffusion blocking capability of the capping layer 123, which is closely related with the thickness of the capping layer 123. That is, as the thickness of the capping layer 123 increases, the amount of diffusing metal catalyst 125a, 125b decreases, and leads to an increase in the sizes of crystal grains. In contrast, as the thickness of the capping layer 123 decreases, the amount of diffusing metal catalyst 125a, 125b increases, and leads to a decrease in the sizes of crystal grains. The relationship between the amount of diffused metal catalysts and the sizes of crystal grains will be discussed in reference to FIG. 2D further below.

As shown in FIG. 2C, the first annealing process 127 is performed at a temperature in the range at or between 200 and 800° C. for several seconds to several hours to diffuse the metal catalysts 125a and 125b using a furnace process, a rapid thermal annealing (RTA) process, a UV process, a laser process, or combinations thereof. However, the first annealing process need not be so limited.

Figure 2D:
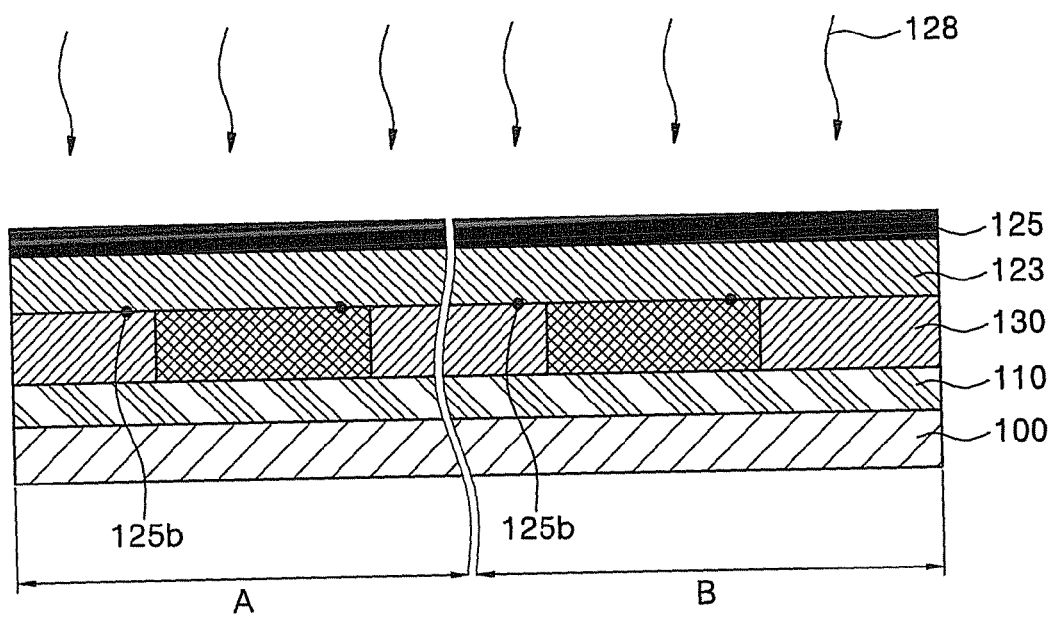

FIG. 2D is a cross-sectional view illustrating a process of crystallizing the amorphous silicon layer 120 into a polysilicon layer 130 by the diffused metal catalyst 125b by applying a second annealing process represented by 128 to the substrate 100.

As shown in FIG. 2D, the amorphous silicon layer 120 (see FIG. 2C) is crystallized to a polysilicon layer 130 by the metal catalyst 125b diffused into the surface of the amorphous silicon layer 120 (see FIG. 2C) through the capping layer 123 by a second annealing process 128. That is, the metal catalyst 125b of the metal catalyst layer 125 becomes bonded to silicon of the amorphous silicon layer 120 to form a metal silicide, and the metal silicide acts as a seed of the crystallization to induce the amorphous silicon layer 120 or portions thereof to be crystallized.

Accordingly, having more diffused metal catalyst 125b leads to having more metal silicide as seeds, and more crystal grains. However, having more crystal grains leads to sizes of the crystal grains being smaller. On the other hand, having less diffused metal catalyst 125b leads to having less metal silicide as seeds, and less crystal grains. However, having less crystal grains leads to sizes of the crystal grains being larger.

Accordingly, the crystallization method of the aspects of the present invention includes forming a capping layer 123 on an amorphous silicon layer 120, forming a metal catalyst layer 125 on the capping layer 123, performing first and second annealing processes 127, 128 to diffuse a metal catalyst 125a, 125b and then crystallizing the amorphous silicon layer 120 to a polysilicon layer 130 using the diffused metal catalyst 125b, which is referred to as a super grain silicon (SGS) crystallization method.

Therefore, it is possible to adjust the crystal grain size of the polysilicon layer 130 by adjusting the amount of the metal silicide, i.e., the seed of the crystallization. In turn, the adjustment of the crystal grain size is determined by the metal catalyst 125b contributing to the formation of the metal silicide, and the crystallization of the amorphous silicon layer 120 by the metal silicide. Therefore, it is possible to adjust the crystal grain size of the polysilicon layer 130 by adjusting a diffusion blocking capability of the capping layer 123 relative to the diffusion of the metal catalyst 125b. The diffusion blocking capability of the capping layer 123 increases with its thickness, for example. Accordingly, it is possible to adjust the crystal grain size of the polysilicon layer 130 by adjusting the thickness of the capping layer 123.

In the aspect shown in FIG. 2D, the second annealing process 128 to increase the crystal grain size is performed without removing the capping layer 123 and the metal catalyst layer 125. In other aspects, the second annealing process 128 may be performed after removing the capping layer 123 and the metal catalyst layer 125. In yet other aspects, the metal catalyst layer 125 may be removed after the first annealing process 127 is performed to diffuse the metal catalysts 125a, 125b (see FIG. 2C), and the capping layer 123 may be removed after the second annealing process 128. The second annealing process 128 may be performed at a temperature at or between 400 and 1300° C. over a desired time period using furnace, RTA, UV, and/or laser processes.

Figure 2E:
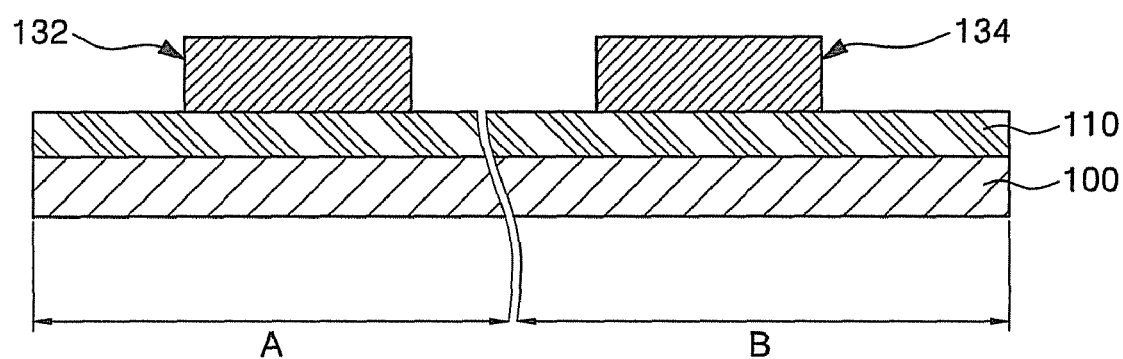

In the aspect as shown in FIG. 2E, the capping layer 123 (see FIG. 2D) and the metal catalyst layer 125 (see FIG. 2D) are removed to form first and second semiconductor layers 132 and 134 in first and second regions A and B using a first pattern mask (not shown), respectively. The first pattern mask is a mask to form a pattern on the substrate 100, and may be a photo mask or a shadow mask without restriction. To form the first and second semiconductor layers 132 and 134, a photoresist layer (not shown) is formed on the polysilicon layer 130 (see FIG. 2D), and then the photoresist layer is exposed and developed to form a photoresist pattern using the first pattern mask (not shown) (i.e., a first photo mask). The photoresist pattern is used as a mask to etch the polysilicon layer 130 (see FIG. 2D). As a result, the first semiconductor layer 132 is formed in the first region A, and the second semiconductor layer 134 is formed in the second region B.

Figure 2F:
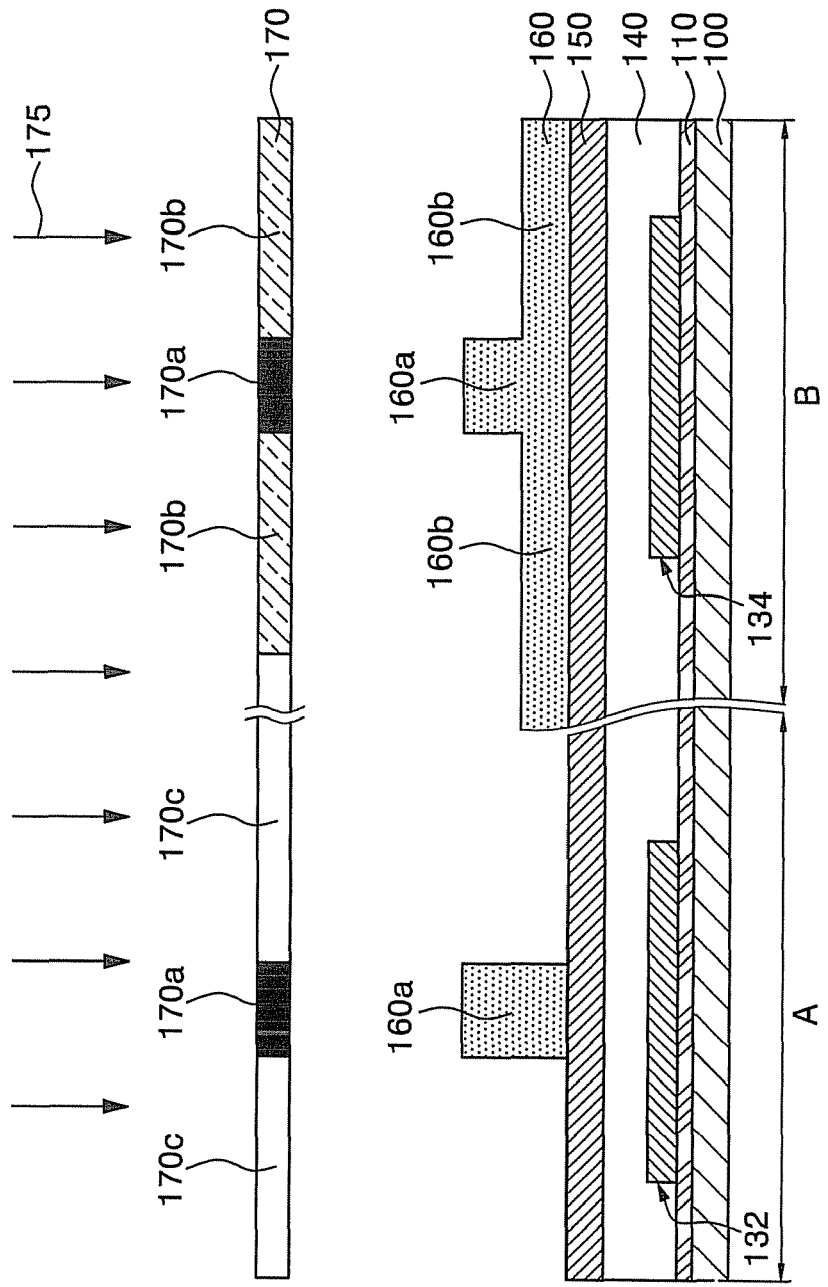

Next, as shown in FIG. 2F, a gate insulating layer 140 is formed on the substrate 100, on which the semiconductor layers 132 and 134 are formed and covers the layers 132, 134. The gate insulating layer 140 may be a silicon oxide layer, a silicon nitride layer, or a double layer of a silicon oxide layer and a silicon nitride layer.

A gate conductive layer 150 is formed on the gate insulating layer 140. By way of example, the gate conductive layer 150 may be a single layer formed of aluminum (Al), an aluminum alloy such as Al—Nd, or a multi-layer in which the aluminum alloy is deposited on a chromium (Cr) or molybdenum (Mo) alloy.

Subsequently, a photoresist layer of which a photoresist pattern 160 is a part is formed on the gate conductive layer 150. The photoresist layer is exposed (represented by 175) and developed to form the photoresist pattern 160 using a second pattern mask (i.e., a half-tone mask 170). As shown in FIG. 2F, the half-tone mask 170 is a photo mask that can adjust the luminous intensity of light transmitted therethrough. The half-tone mask 170 includes light shielding parts 170a corresponding to central parts of the first and second semiconductor layers 132 and 134, half tone parts 170b corresponding to ends of the second semiconductor layer 134 which transmits a portion of the light, and light transmission parts 170c corresponding to ends of the first semiconductor layer 132 which transmits basically all of the light. The photoresist pattern 160 that is formed has thick parts 160a corresponding to the light shielding parts 170a, and thin parts 160b corresponding to the half tone parts 170b. The photoresist pattern 160 also has the light transmission parts 170c that expose the gate conductive layer 150 of the first semiconductor layer 132. Therefore, the thick parts 160a are formed at parts of the photoresist pattern 160 corresponding to central parts of the semiconductor layers 132 and 134, and the thin parts 160b are formed at parts of the photoresist pattern 160 corresponding to ends of the second semiconductor layer 134.

Figure 2H:
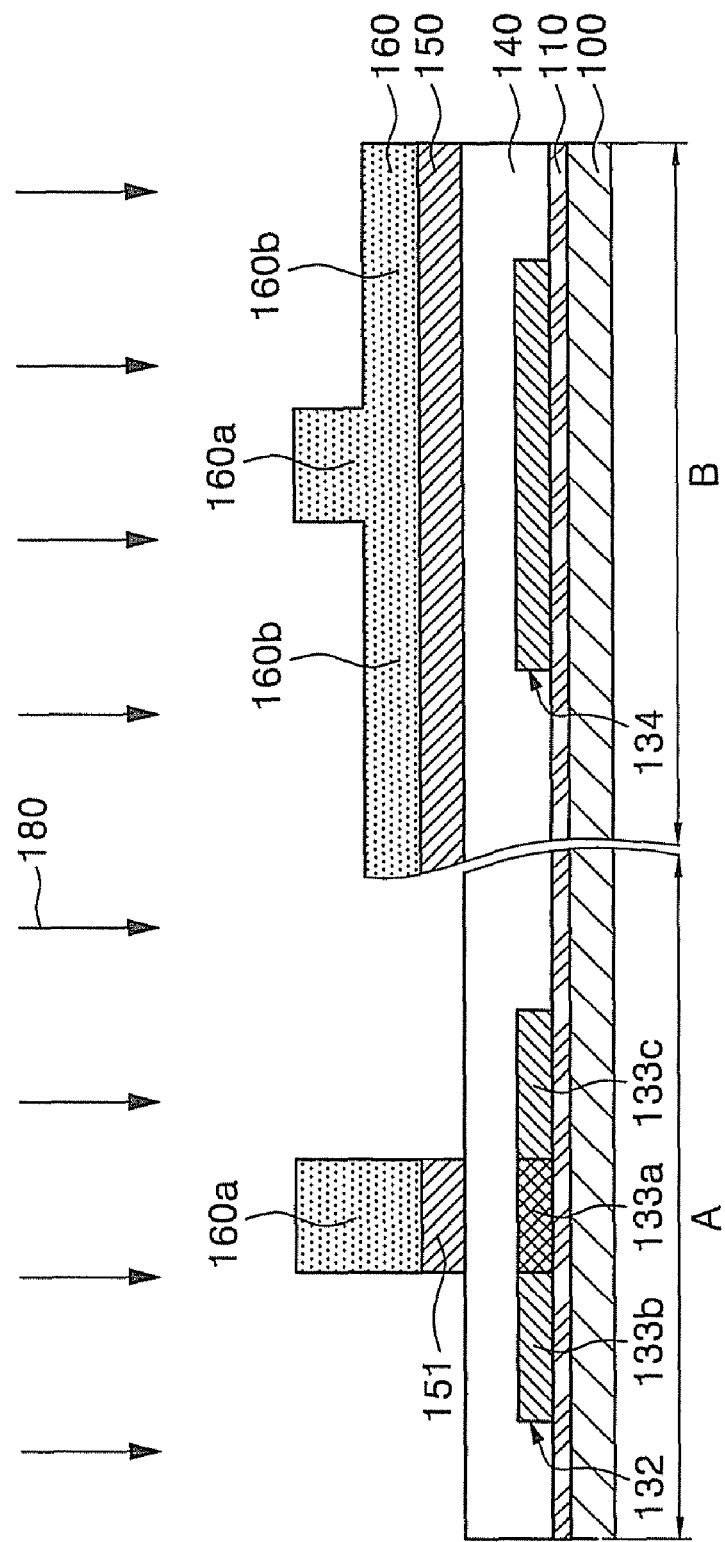

Then, in part A as shown in FIG. 2G, the gate conductive layer 150 is etched using the photoresist pattern 160 as a mask to form a first gate electrode 151 overlapping (or over) the central part of the first semiconductor layer 132. By way of example, the gate conductive layer 150 may be etched by a dry etching method or a wet etching method. FIG. 2H is a cross-sectional view illustrating a process of implanting first impurities using a photoresist pattern.

As shown in FIG. 2H, first impurities 180 are implanted into the substrate 100 in a first region A having a cover over only the channel region 133a of the first semiconductor layer 132, and a second region B having a fully covered second semiconductor layer 134. Therefore, the second semiconductor layer 134 is perfectly shielded by the photoresist pattern 160 formed on the second region B and the first impurities 180 cannot be implanted into the second semiconductor layer 134. On the other hand, only a first channel region 133a of the first semiconductor layer 132 is shielded by the photoresist pattern 160a formed on the first region A and the first impurities 180 can be implanted into first source and drain regions 133b and 133c, and not the first channel region 133a. Accordingly, the first source and drain regions 133b and 133c of the first semiconductor layer 132 are formed.

By way of example, the first impurities 180 implanted into the first source and drain regions 133b and 133c of the first semiconductor layer 132 formed in the first region A are p-type impurities to form a PMOS thin film transistor. The p-type impurities may be at least one of boron (B), aluminum (Al), gallium (Ga), indium (In), or combinations thereof. In aspects of the present invention, boron (B) ions may be used as the first impurities. Alternatively, the first impurities may be $B_2H_x^+$, $BH_x^+$ where $(x=1, 2, 3, \ldots)$, and/or elements of group 3 of the periodic table. In this aspect, boron (B) ions are implanted at a dose of $6 \times 10^{13}/cm^2$ to $5 \times 10^{15}/cm^2$. When the boron (B) ions are implanted at a dose of less than $6 \times 10^{13}/cm^2$, leakage current may be generated, and when the boron (B) ions are implanted at a dose of more than $5 \times 10^{15}/cm^2$, resistance may increase, thus leading to an increase in the driving voltage. In addition, the boron (B) ions are implanted at an acceleration voltage of 10 keV to 100 keV, and as a vertical average transfer path, a projection range Rp (a straight distance from a surface), is set to be positioned within about ±500 Å from an interface between the polysilicon layer 130 and the gate insulating layer 140.

Next, in part B as shown in FIG. 2I, the thin part 160b (see FIG. 2H) of the photoresist pattern 160 is etched to expose the gate conductive layer 150 (see FIG. 2H) on the ends of the second semiconductor layer 134. The gate conductive layer 150 is etched to form a second gate electrode 152 overlapping (or over) the central part of the second semiconductor layer 134. Therefore, the first gate electrode 151 and the thick part 160a of the photoresist pattern disposed on the first gate electrode 151 remain on the first region A, and the second gate electrode 152 and the thick part 160a of the photoresist pattern disposed on the second gate electrode 152 remain on the second region B. By way of example, the thin part 160b (see FIG. 2H) of the photoresist pattern 160 may be etched by an ashing method using oxygen plasma. Afterwards, the thick parts 160a of the photoresist pattern (not shown) may be partially etched at its upper part.

FIG. 2J is a cross-sectional view illustrating a process of implanting second impurities into first and second regions. As shown in FIG. 2J, second impurities 190 are implanted into portions of the first and second semiconductor layers 132 and 134 in the first and second regions A and B using the gate electrodes 151 and 152 as masks. The second impurities 190 are implanted into ends of the second semiconductor layer 134 formed in the second region B to form second source and drain regions 135b and 135c. The second impurities 190 implanted into the first region A also perform a gettering function of removing the very small amount of the metal catalyst 125b remaining in the channel region 133a of the first semiconductor layer 132 when the first semiconductor layer 132 of the first region A is formed by an SGS crystallization method. In various aspects, by gettering, the remaining amount of metal catalyst 125b are removed from the bulk of the first semiconductor layer 132, such as the channel region 133a, into boundaries of crystal grains.

As noted, the second impurities 190 are implanted into the second semiconductor layers 134 in the second region B to form the second source and drain regions 135b and 135c. A second channel region 135a of region A, into which the second impurities 190 are not implanted, is disposed between the second source and drain regions 135b and 135c. The second impurities 190 may be n-type impurities and may be one of phosphorus (P), $PH_x^+$ and/or $P_2H_x^+$ where $(x=1, 2, 3, \ldots)$, and elements of group 5 of the periodic table. Preferably, but not required, the second impurities 190 used is phosphorus (P), which is implanted at a dose of $1 \times 10^{11}/cm^2$ to $3 \times 10^{15}/cm^2$. When the second impurities 190 are implanted at a dose of less than $1 \times 10^{11}/cm^2$, the amount of implanted phosphorus (P) is insufficient to remove the very small amount of metal catalyst such as nickel (Ni) remaining in the first semiconductor layer 132. On the other hand, when the second impurities 190 are implanted at a dose of more than $3 \times 10^{15}/cm^2$, resistance of the first semiconductor layer 132 may increase. Here, owing to the high atomic weight of phosphorus (P), as the dose of the phosphorus ions increases, the resistance does not decrease at a typical annealing temperature. This electrical effect results from the fact that the phosphorus ions are not activated very well. Therefore, the second impurities 190 such as phosphorus (P), performing the gettering function, are implanted at an acceleration voltage of 10 keV to 100 keV, and as a vertical average transfer path, a projection range Rp (a straight distance from a surface), is set to be positioned within about ±500 Å from an interface between the polysilicon layer 130 and the gate insulating layer 140.

Figure 2K:
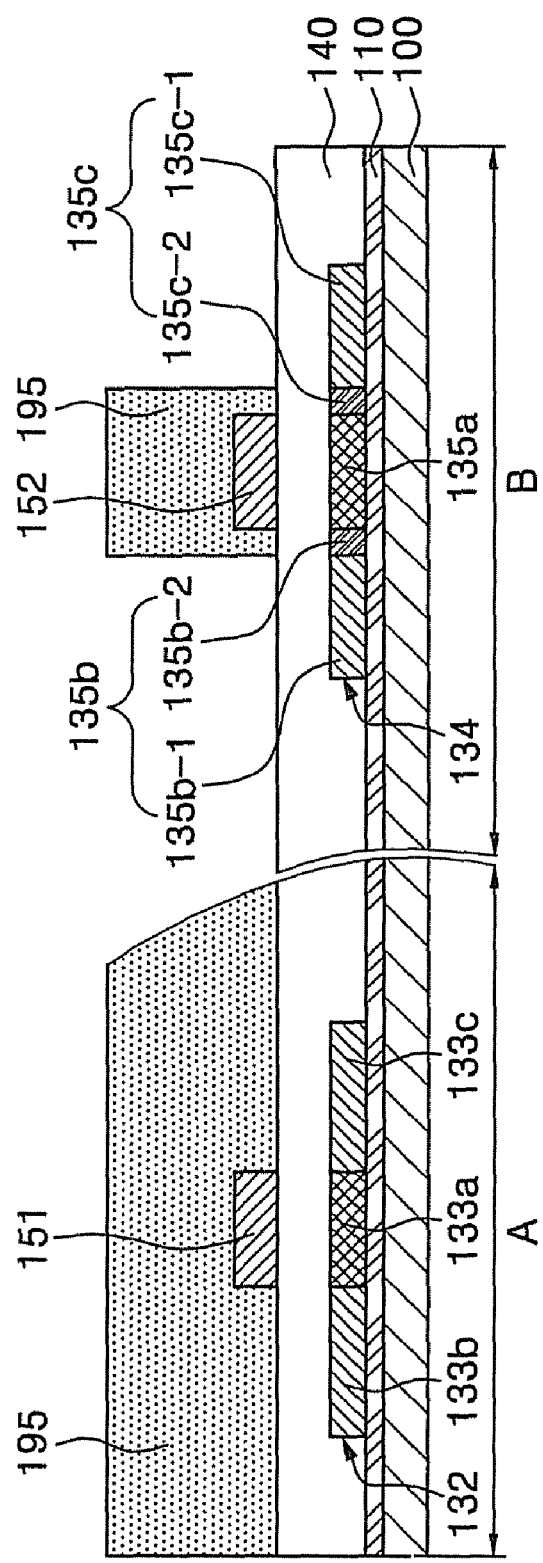

Then, as shown in FIG. 2K, the photoresist pattern 160a is removed to expose the first and second gate electrodes 151 and 152. Next, a photoresist layer, of which the photoresist 195 is a part, is formed on the exposed gate electrodes 151 and 152, and then exposed and developed to form a photoresist pattern 195 using a third pattern mask.

The photoresist pattern 195 covers the entire first region A, but only a part of the second region B, such as the second gate electrode 152, and the exposed portion of the gate insulating layer 140 around the second gate electrode 152. Third impurities (not shown) are implanted into the second semiconductor layer 134 of the second region B using the photoresist pattern 195 as a mask (not shown). The third impurities may be a high concentration n-type impurities. In the second semiconductor layer 134 of the second region B, the second source and drain regions 135$b$ and 135$c$ may include regions 135$b$-1 and 135$c$-1 in which the n-type impurities are implanted at a high concentration, and regions 135$b$-2 and 135$c$-2 in which the n-type impurities are implanted at a low concentration, and which are located at one side of each of the regions 135$b$-1 and 135$c$-1. Accordingly, regions 135$b$-2 and 135$c$-2 are lightly doped drain (LDD) regions. While an NMOS thin film transistor may generate leakage current, into which electrons are tunneled, the LDD regions 135$b$-2 and 135$c$-2 of the second source and drain regions 135$b$ and 135$c$ can reduce the leakage current and suppress generation of hot carriers due to gate induced drain leakage (GIDL) generated by a rapid change in concentration of source and drain regions 135$b$ and 135$c$ and a channel region 135$a$, thereby improving reliability.

Subsequently, the photoresist pattern 195 is removed and a third annealing process is performed to remove the metal catalyst (Ni and so on). The third annealing process (not shown) is performed at a temperature at or between 500 and 800° C. for 1 to 120 minutes. The third annealing process also further crystallizes the amorphous silicon layer 120 into a polysilicon layer 130 by the third annealing process using an SGS crystallization method, as well as removing the very small amount of metal catalyst (Ni and so on) remaining in the semiconductor layer 132 to form a CMOS thin film transistor having good electrical characteristics.

Figure 3A:
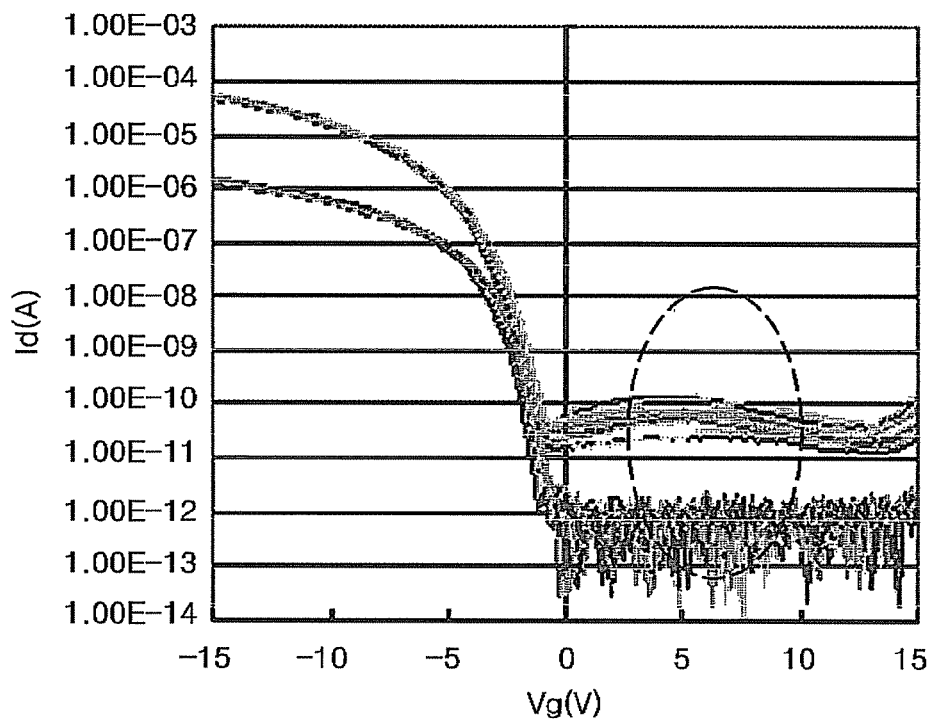
FIG. 3A is a graph showing characteristics of a gate voltage (Vg) and drain current (Id) when second impurities are not implanted.
Figure 3B:
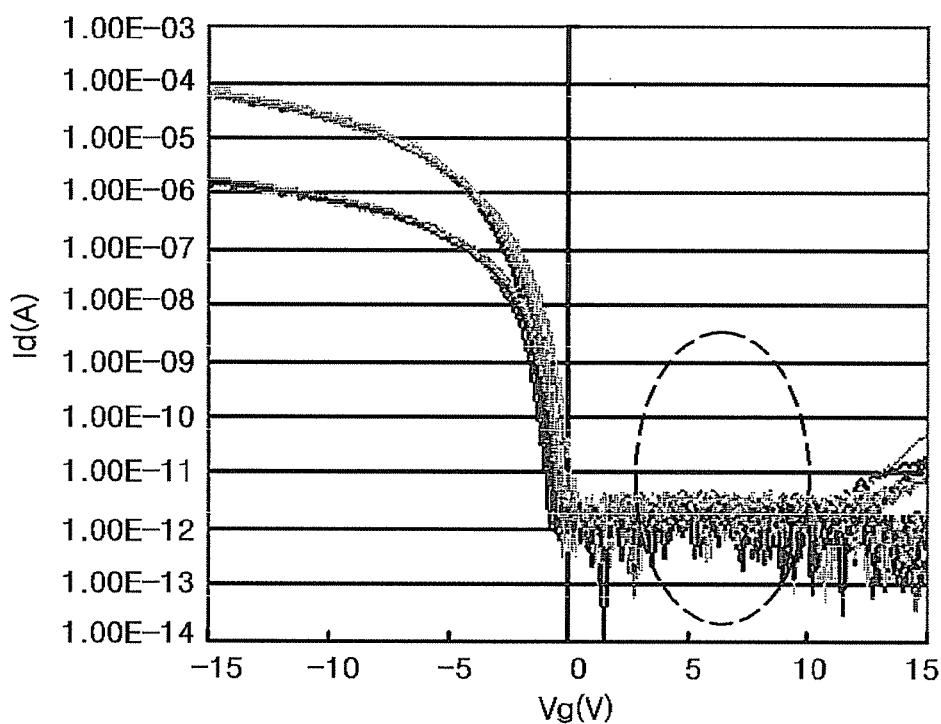
FIG. 3B is a graph showing characteristics of Vg and Id after implanting phosphorus (P) as second impurities and performing a third annealing process.

As described above, when the second impurities (such as phosphorus (P)) are implanted into the first source and drain regions 133$b$ and 133$c$ of the first region A and then the third annealing process is performed to form a PMOS thin film transistor in the first region A, characteristics as shown in FIG. 3B of the PMOS thin film transistor is improved. FIG. 3A is a graph showing characteristics of gate voltages Vg and drain currents Id when second impurities performing a gettering function are not implanted. FIG. 3B is a graph showing characteristics of the Vg and the Id after implanting phosphorus (P) as second impurities and performing a third annealing process. From these graphs, it will be appreciated that characteristics of the thin film transistor are improved when the second impurities as gettering materials are implanted and then the third annealing process is performed, as shown inside the dotted lines of FIGS. 3A and 3B.

Therefore, in order to form a PMOS thin film transistor in the first region A and to remove the metal catalyst remaining in the semiconductor layer of the PMOS thin film transistor, the second impurities such as phosphorus (P) (i.e., n-type impurities) are implanted into the semiconductor layer of the PMOS thin film transistor in the first region A, while at the same time the n-type impurities are implanted into the NMOS thin film transistor in the second region B. Accordingly, the number of masks is reduced and the process of manufacturing the CMOS thin film transistor is simplified.

Figure 4:
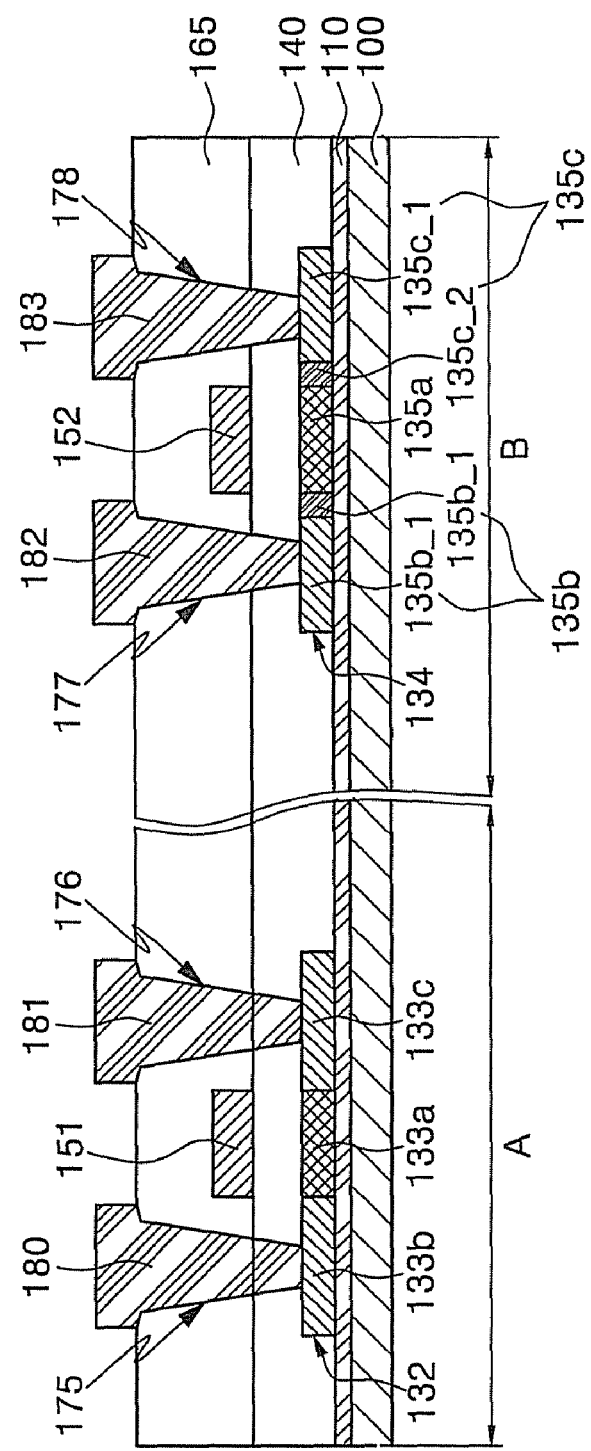
FIG. 4 is a cross-sectional view illustrating a process of fabricating a CMOS thin film transistor using a semiconductor layer fabricated according to the aspect of FIGS. 2A to 2K.

FIG. 4 is a cross-sectional view illustrating a process of fabricating a CMOS thin film transistor using a semiconductor layer fabricated according to the aspect of the present invention according to FIGS. 2A-2K. As shown in FIG. 4, after forming an interlayer insulating layer 165 to protect a lower structure on the gate electrodes 151 and 152, predetermined regions of the interlayer insulating layer 165 and the gate insulating layer 140 are etched to form contact holes 175-178. Then, source electrodes 180 and 182, and the drain electrodes 181 and 183, respectively filling the contact holes 175,177 and 176,178 are formed to manufacture a CMOS thin film transistor including the semiconductor layers 132 and 134 having the source regions 133$b$ and 135$b$, drain regions 135$b$ and 135$c$, and the channel regions 133$a$ and 135$a$.

Therefore, controlling the amount of metal catalyst using a capping layer 123 enables a CMOS thin film transistor that includes the semiconductor layer containing a smaller amount of metal catalyst and larger polysilicon grains than that produced with a metal induced crystallization (MIC) or metal induced lateral crystallization (MILC) method.

Figure 5A:
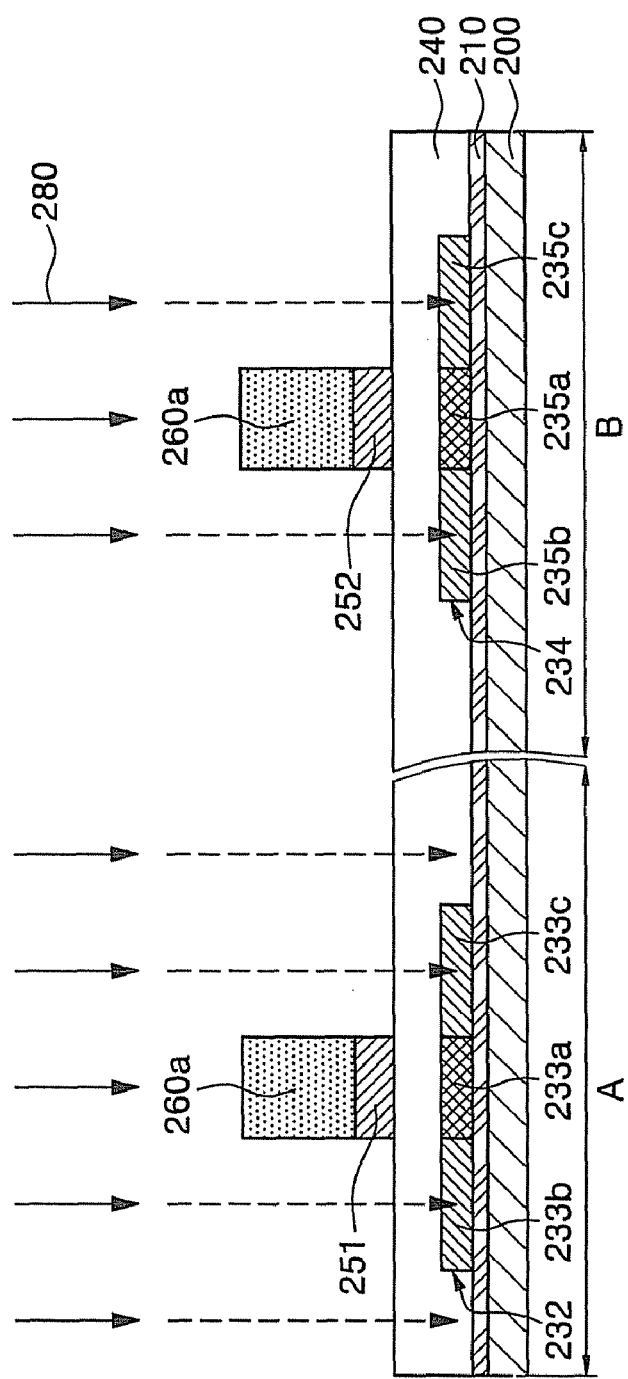
FIGS. 5A and 5B are cross-sectional views illustrating a method of fabricating a CMOS thin film transistor according to another aspect of the present invention.
Figure 5B:
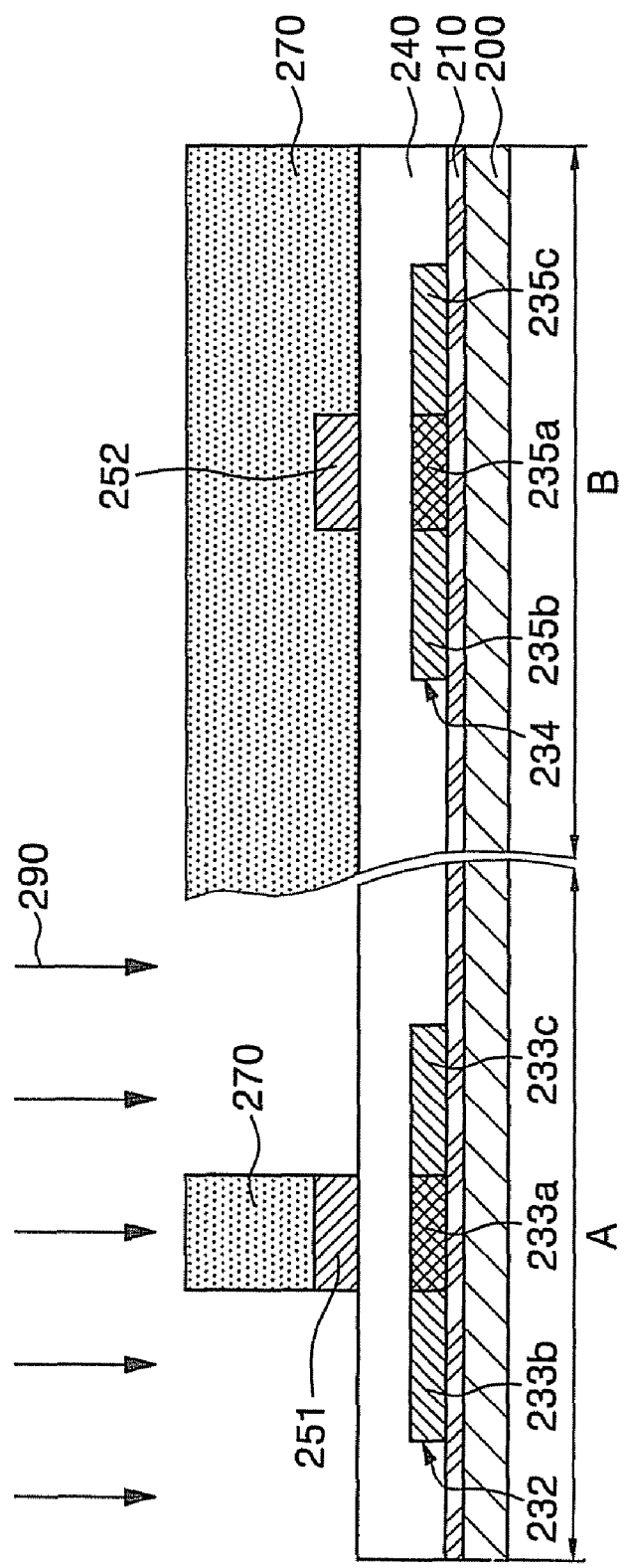

FIGS. 5A and 5B are cross-sectional views illustrating a method of fabricating a CMOS thin film transistor according to another aspect of the present invention. Since the aspect of the present invention according to FIGS. 5A and 5B is performed under mostly the same process conditions (e.g., the dose of a gettering material and the implantation conditions such as temperature) as the aspect of FIGS. 2A-2K except for the order of implanting the gettering material and implanting the p-type impurities during fabrication of a p-type TFT, only the process of implanting the gettering material and the process of implanting p-type impurities will be described in detail.

FIG. 5A is a cross-sectional view illustrating a process of implanting a gettering material into a substrate in order to remove the very small amount of metal catalyst remaining in a semiconductor layer. As shown in FIG. 5A, in order to remove the very small amount of metal catalyst remaining in a semiconductor layer 232, first impurities 280, i.e., gettering materials, are implanted. The gettering materials are implanted into positions at which source regions 233$b$ and 235$b$, and drain regions 233$c$ and 235$c$ of both ends of semiconductor layers 232 and 234 are formed. In this process, the first impurities may be one of phosphorus (P), $PH_x^+$ and/or $P_2H_x^+$ where (x=1, 2, 3, . . . ), and the elements of group 5 of the periodic table.

Preferably, but not required, the first impurities 280 use phosphorus (P) as the gettering material, which is implanted at a dose of $1 \times 10^{11}/cm^2$ to $3 \times 10^{15}/cm^2$. When the first impurities 280 are implanted at a dose of less than $1 \times 10^{11}/cm^2$, the amount of implanted phosphorus (P) is insufficient to getter the very small amount of metal catalyst such as nickel (Ni) remaining in the semiconductor layer 232. On the other hand, when the first impurities 280 are implanted at a dose of more than $3 \times 10^{15}/cm^2$, resistance of the semiconductor layer 232 may increase. Here, owing to the high atomic weight of phosphorus (P), as the dose of the phosphorus ions increases, the resistance does not decrease at a typical annealing temperature. This electrical effect results from the fact that the phosphorus ions are not activated very well. Therefore, the first impurities 280 (such as phosphorus (P)) are implanted at an acceleration voltage of 10 keV to 100 keV, and as a vertical average transfer path, a projection range Rp (a straight distance from a surface), is set to be positioned within about ±500 Å from an interface between a polysilicon layer (from which semiconductor layers 232 and 234 are made) and a gate insulating layer 240.

As described above, the first impurities 280 are implanted using the gate electrodes 251 and 252 as masks to form the source regions 233$b$ and 235$b$, and drain regions 233$c$ and 235$c$. Thereafter, as shown in FIG. 5B, the entire second region B and only the gate electrode 251 of the first region A is covered with a photoresist pattern 270. Then, second impurities 290 are implanted into the first region A. The second impurities 290 used are p-type impurities to form a PMOS thin film transistor. The p-type impurities may be boron (B), aluminum (Al), gallium (Ga), and/or indium (In). In this aspect of the present invention, boron (B) ions may be used as the second impurities. Alternatively, the second impurities may be $B_2H_x^+$ and/or $BH_x^+$ where (x=1, 2, 3, . . . ), or the elements of group 3 of the periodic table. In this aspect of the present invention, boron (B) ions are implanted at a dose of $6\times10^{13}/cm^2$ to $5\times10^{15}/cm^2$. When the boron (B) ions are implanted at a dose of less than $6\times10^{13}/cm^2$, leakage current may be generated, and when the boron (B) ions are implanted at a dose of more than $5\times10^{15}/cm^2$, resistance may increase, thus leading to an increase in a driving voltage. In addition, the boron (B) ions are implanted at an acceleration voltage of 10 keV to 100 keV, and as a vertical average transfer path, a projection range Rp (a straight distance from a surface), is set to be positioned within about ±500 Å from an interface between the polysilicon layer (not shown) and the gate insulating layer 240.

After performing the above processes, an LDD region is formed in the second semiconductor layer 234 of the second region B, similar to the aspect of FIGS. 2A-2K.

Then, a third annealing process is performed to remove the metal catalyst. The third annealing process is performed at a temperature at or between 500 and 800° C. for 1 to 120 minutes. The very small amount of metal catalyst (Ni and so on) remaining in the semiconductor layer 232 of the PMOS thin film transistor is removed by the third annealing process to form a CMOS thin film transistor having good electrical characteristics.

Thereafter, after forming an interlayer insulating layer (not shown) for protecting a lower structure on the gate electrode, predetermined regions of the interlayer insulating layer (not shown) and the gate insulating layer (240) are etched to form contact holes (not shown), and source and drain electrodes (not shown) filling the contact holes are formed to complete the CMOS thin film transistor.

As can be seen from the foregoing, it is possible to minimize the amount of metal catalyst remaining in a semiconductor layer, reduce the number of masks required to fabricate a CMOS thin film transistor, and simplify its manufacturing process.

Although a few aspects of the present invention have been shown and described, it would be appreciated by those skilled in the art that changes may be made in the aspects without departing from the principles and spirit of the invention, the scope of which is defined in the claims and their equivalents.

What is claimed is:

1. A method of fabricating a CMOS thin film transistor, comprising:
    providing a substrate having first and second regions;
    forming an amorphous silicon layer on the substrate;
    forming a capping layer on the entire top surface of the amorphous silicon layer;
    depositing a metal catalyst on the capping layer;
    performing a first annealing process on the substrate to diffuse the metal catalyst through the capping layer to an interface of the amorphous silicon and the capping layer, and to crystallize the amorphous silicon layer into a polysilicon layer using the diffused metal catalyst;
    removing the capping layer;
    patterning the polysilicon layer to form first and second semiconductor layers in the first and second regions, respectively;
    forming a gate insulating layer and a gate electrode on the first and second semiconductor layers;
    implanting first impurities into the first and second semiconductor layers;
    implanting second impurities into the first or second semiconductor layer; and
    performing a second annealing process on the first and second semiconductor layers to remove the metal catalyst remaining in the first or second semiconductor layer having the implanted second impurities,
    wherein the first impurities are implanted at a dose of $6\times10^{13}/cm^2$ to $5\times10^{15}/cm^2$, and the second impurities are implanted at a dose of $1\times10^{11}/cm^2$ to $3\times10^{15}/cm^2$.

2. The method according to claim 1, wherein the first impurities are n-type impurities.

3. The method according to claim 2, wherein the first impurities are elements of group 5 of the periodic table.

4. The method according to claim 2, wherein the first impurities are one of phosphorus (P), $PH_x^+$ and/or $P_2H_x^+$ where (x=1, 2, 3, . . . ).

5. The method according to claim 2, wherein the n-type impurities are implanted at an acceleration voltage of 10 keV to 100 keV.

6. The method according to claim 2, wherein the n-type impurities are implanted so that a projection range (Rp) is within about ±500 Å from an interface between the polysilicon layer and the gate insulating layer.

7. The method according to claim 1, wherein the first impurities are implanted into source and drain regions of the first and second semiconductor layers.

8. The method according to claim 1, wherein the second impurities are p-type impurities.

9. The method according to claim 8, wherein the p-type impurities are one of boron (B), $BH_x^+$ and/or $B_2H_x^+$ where (x=1, 2, 3, . . . ).

10. The method according to claim 9, wherein the p-type impurities are implanted at an acceleration voltage of 10 keV to 100 keV.

11. The method according to claim 9, wherein the p-type impurities are implanted so that a projection range (Rp) is within about ±500 Å from an interface between the polysilicon layer and the gate insulating layer.

12. The method according to claim 1, wherein the second impurities are implanted into source and drain regions of the first or second semiconductor layer.

13. The method according to claim 1, wherein the second annealing process is performed at a temperature between about 500° C. and about 800° C.

14. The method according to claim 1, wherein the capping layer is a silicon oxide layer, a silicon nitride layer, or a double layer of a silicon oxide layer and a silicon nitride layer.

15. The method according to claim 1, wherein the capping layer is formed to a thickness between about 1 and about 2000 Å.

16. The method according to claim 1, wherein the first semiconductor layer of the first region is a PMOS semiconductor layer and the second semiconductor layer of the second region is an NMOS semiconductor layer.

17. The method according to claim 16, wherein the second semiconductor layer is formed to have a channel region, a lightly doped drain (LDD) region, and source and drain regions.

* * * * *